United States Patent
Lai et al.

(10) Patent No.: US 9,831,191 B2
(45) Date of Patent: Nov. 28, 2017

(54) ELECTRONIC PACKAGE, SEMICONDUCTOR SUBSTRATE OF THE ELECTRONIC PACKAGE, AND METHOD FOR MANUFACTURING THE ELECTRONIC PACKAGE

(71) Applicant: Siliconware Precision Industries Co., Ltd., Taichung (TW)

(72) Inventors: Chieh-Lung Lai, Taichung (TW); Mao-Hua Yeh, Taichung (TW); Hung-Yuan Li, Taichung (TW); Shih-Liang Peng, Taichung (TW); Chang-Lun Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/149,576

(22) Filed: May 9, 2016

(65) Prior Publication Data

US 2017/0243834 A1 Aug. 24, 2017

(30) Foreign Application Priority Data

Feb. 24, 2016 (TW) .............................. 105105411 A (51) Int. Cl.

| *H01L 23/498* | (2006.01) |
|---|---|
| *H01L 23/31* | (2006.01) |
| *H01L 21/48* | (2006.01) |
| *H01L 23/00* | (2006.01) |
| *H01L 21/56* | (2006.01) |
| *H01L 21/60* | (2006.01) |

(52) U.S. Cl.
CPC .......... *H01L 23/562* (2013.01); *H01L 21/486* (2013.01); *H01L 21/4853* (2013.01); *H01L 21/565* (2013.01); *H01L 23/3114* (2013.01); *H01L 23/49811* (2013.01); *H01L 23/49827* (2013.01); *H01L 23/49838* (2013.01); *H01L 2021/60022* (2013.01)

(58) Field of Classification Search
CPC ... H01L 23/562; H01L 21/486; H01L 21/565; H01L 21/4853; H01L 23/49827; H01L 23/49838; H01L 23/3114; H01L 23/49811; H01L 2021/60022
USPC ......................................... 257/668, 751, 777
See application file for complete search history.

(56) References Cited

U.S. PATENT DOCUMENTS

| 2008/0088031 A1* | 4/2008 | Kwon | ................. H01L 25/0657 257/777 |
|---|---|---|---|
| 2009/0302478 A1* | 12/2009 | Pagaila | ................. H01L 21/568 257/774 |
| 2014/0021612 A1* | 1/2014 | Huang | .............. H01L 21/76898 257/751 |

(Continued)

*Primary Examiner* — Caleen Sullivan
(74) *Attorney, Agent, or Firm* — Mintz Levin Cohn Ferris Glovsky and Popeo, P.C.; Peter F. Corless; Steven M. Jensen (57) ABSTRACT

A semiconductor substrate is provided, including a substrate body, a plurality of conductive through holes penetrating the substrate body, and at least one pillar disposed in the substrate body with the at least one pillar being free from penetrating the substrate body. When the semiconductor substrate is heated, the at least one pillar adjusts the expansion of upper and lower sides of the substrate body. Therefore, the upper and lower sides of the substrate body have substantially the same thermal deformation, and the substrate body is prevented from warpage.

8 Claims, 4 Drawing Sheets

(56) References Cited

U.S. PATENT DOCUMENTS

2014/0210085 A1\* 7/2014 Wang ................ H01L 23/53238
　　　　　　　　　　　　　　　　　　　　257/751

\* cited by examiner

ELECTRONIC PACKAGE, SEMICONDUCTOR SUBSTRATE OF THE ELECTRONIC PACKAGE, AND METHOD FOR MANUFACTURING THE ELECTRONIC PACKAGE

CROSS-REFERENCES TO RELATED APPLICATIONS

This application claims under 35 U.S.C. §119(a) the benefit of Taiwanese Patent Application No. 105105411 filed Feb. 24, 2016, the entire contents of which are incorporated herein by reference.

BACKGROUND

1. Technical Field

The present disclosure relates to processes for manufacturing a semiconductor package, and, more particularly, to an electronic package, a semiconductor substrate of the electronic package and a method for manufacturing an electronic package that has an increased production yield.

2. Description of Related Art

With the rapid development of the electronics industry, electronic products are manufactured following a multi-purpose, high-performance trend. Techniques currently used in the field of chip packaging includes flip-chip packages, such as Chip Scale Package (CSP), Direct Chip Attached (DCA) or Multi-Chip Module (MCM), or chip stacking technique that integrates chips into a three-dimensional stack of chips (3D IC).

Figure 1:
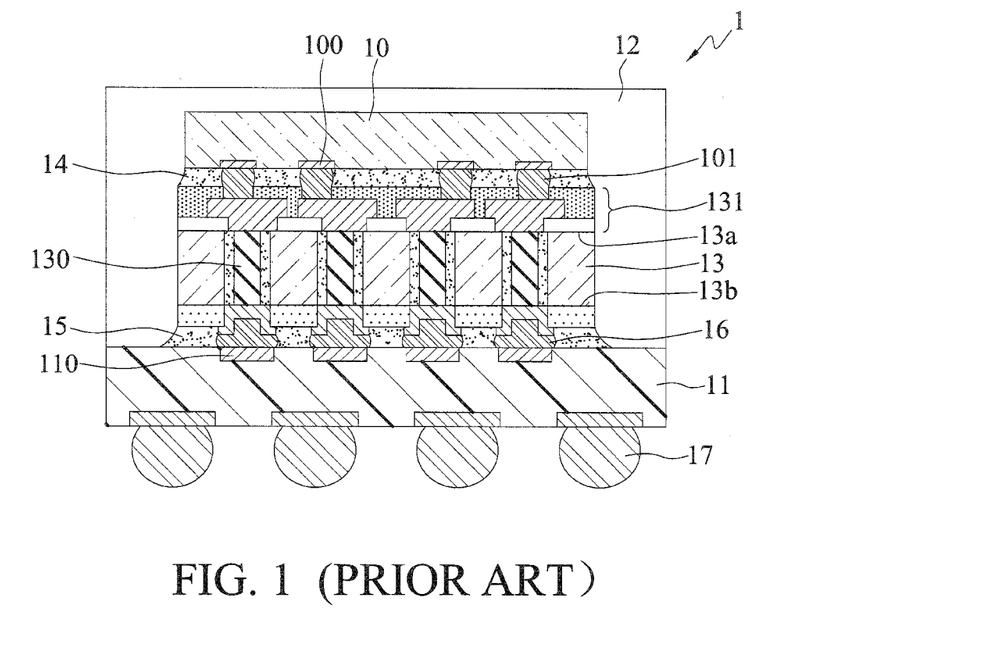
FIG. 1 is a cross-sectional diagram of a conventional semiconductor package.

FIG. 1 is a cross-sectional diagram of a traditional semiconductor package 1. The semiconductor package 1 includes a package substrate 11 and a semiconductor chip 10, with a through silicon interposer (TSI) 13 disposed therebetween. The TSI 13 has through-silicon vias (TSVs) 130 and a redistribution layer (RDL) 131 formed on the top of the TSVs 130, such that the TSVs 130 are electrically connected to solder pads 110 of the package substrate 11 with a greater pitch by a plurality of conductive elements 16. Conductive elements 16 are then covered with underfill 15. Electrode pads 100 of the semiconductor chip 10 with a smaller pitch are electrically connected to the RDL 131 by a plurality of solder bumps 101. The solder bumps 101 are then covered by underfill 14. Finally, an encapsulant 12 is formed on the package substrate 1 to encapsulate the semiconductor chip 10 and the TSI 13.

In a subsequent manufacturing process, a plurality of solder balls 17 are disposed on the lower side of the package substrate 11 for a circuit board (not shown) to be combined therewith.

However, in the manufacturing processes of the traditional semiconductor package 1, before a singulation process is performed, the whole structure 1' (including a plurality of semiconductor packages 1) as shown in FIG. 1', when experiencing a high-temperature operation such as a reflow process, may undergo warpage as a result of large mismatch between the coefficients of thermal expansion (CTE) of the semiconductor chip 10, the encapsulant 12 and the TSI 13. Warpage may be convex bending (such as that shown in FIG. 1') or concave bending. As a result, the semiconductor package 1 after the singulation process is performed will not stay flat, and issues such as non-wetting may occur when the semiconductor package 1 is subsequently attached to the circuit board, causing poor electrical connection.

Therefore, there is a need for a solution that addresses the aforementioned issues in the prior art.

SUMMARY

In view of the aforementioned shortcomings of the prior art, the present disclosure provides a semiconductor substrate, which may include: a substrate body; a plurality of conductive through holes formed in the substrate body and penetrating the substrate body; and at least one pillar formed in the substrate body with the at least one pillar free from penetrating the substrate body.

The present disclosure further provides a method for manufacturing a semiconductor substrate, which may include: providing a substrate body formed with a plurality of conductive through holes penetrating therethrough; forming on the substrate body at least one via that is free from penetrating the substrate body; and forming a pillar in the via.

The present disclosure also provides a method for manufacturing a semiconductor substrate, which may include: providing a substrate body; forming at least one via and a plurality of holes on the substrate body, wherein the holes are deeper than the at least one via; and forming a conductive through hole in each of the holes, and forming a pillar in the at least one via, wherein the conductive through holes penetrate the substrate body, and the pillar is free from penetrating the substrate body.

In an embodiment, the substrate body is a silicon-containing board.

In an embodiment, the substrate body is defined with a surface having a central area and a periphery area surrounding the central area, and the conductive through holes are positioned within the central area, and the pillars are positioned within the periphery area.

In an embodiment, the substrate body is formed with a redistribution structure thereon that is electrically connected to the conductive through holes.

In an embodiment, the pillar contains a conductive material.

The present disclosure yet provides an electronic package, which may include: a package substrate; the aforementioned semiconductor substrate; an electronic component provided on the semiconductor substrate and electrically connected to the conductive through holes; and an encapsulating layer formed on the package substrate and encapsulating the semiconductor substrate and the electronic component.

The present disclosure still provides a method for manufacturing an electronic package, which may include: providing the aforementioned semiconductor substrate; providing an electronic component and a package substrate on two opposing sides of the semiconductor substrate, respectively, and electrically connecting the electronic component and the package substrate to the conductive through holes; and forming on the package substrate an encapsulating layer that encapsulates the electronic component and the semiconductor substrate.

In an embodiment, the pillar is provided by: forming a via in the semiconductor substrate; and forming a conductive material in the via to form the pillar.

In an embodiment, the conductive through holes and the pillars are formed separately. In another embodiment, the conductive through holes and the pillars are formed simultaneously.

In an embodiment, the semiconductor substrate is formed with a redistribution structure thereon that is electrically connected to the conductive through holes, and the electronic component is combined on the redistribution structure. In another embodiment, the redistribution structure is combined with the package substrate.

It can be seen from the above that in the electronic package, the semiconductor substrate of the electronic package and the method for manufacturing the electronic package according to the present disclosure, pillars that do not penetrate the substrate body are provided in the semiconductor substrate. Accordingly, when the semiconductor substrate is heated, the pillars are able to adjust the expansion of the upper and lower sides of the substrate body, such that the upper and lower sides of the substrate body have substantially the same thermal deformation, thereby preventing the semiconductor substrate from warpage.

Furthermore, since the semiconductor substrate is capable of balancing the expansion of the upper and lower sides of the substrate body, the electronic package is prevented from warpage, even if the electronic package of the present disclosure undergoes high temperature operations. When the electronic package is subsequently attached onto a circuit board, non-wetting would not occur, thereby increasing the production yield.

BRIEF DESCRIPTION OF THE DRAWINGS

The present disclosure can be more fully understood by reading the following detailed description of the preferred embodiments, with reference made to the accompanying drawings, wherein:

FIG. 1' is an isometric view of FIG. 1;

DETAILED DESCRIPTION OF THE EMBODIMENTS

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "up", "down", "bottom", "first", "second", "a" and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2A:
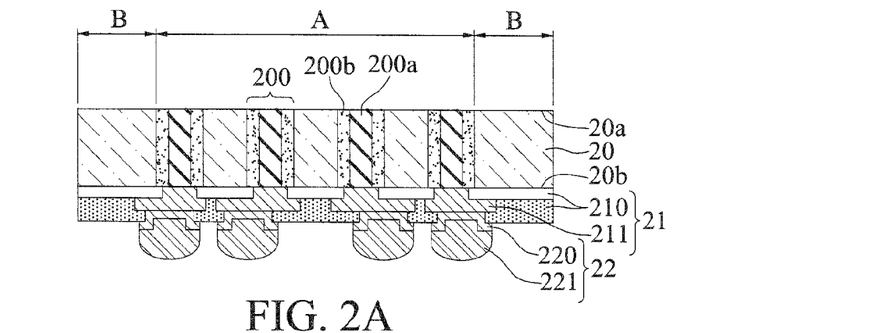
FIGS. 2A to 2C are cross-sectional diagrams illustrating a method for manufacturing a semiconductor substrate in accordance with a first embodiment of the present disclosure, wherein FIG. 2C' is another embodiment of FIG. 2C.
Figure 2B:
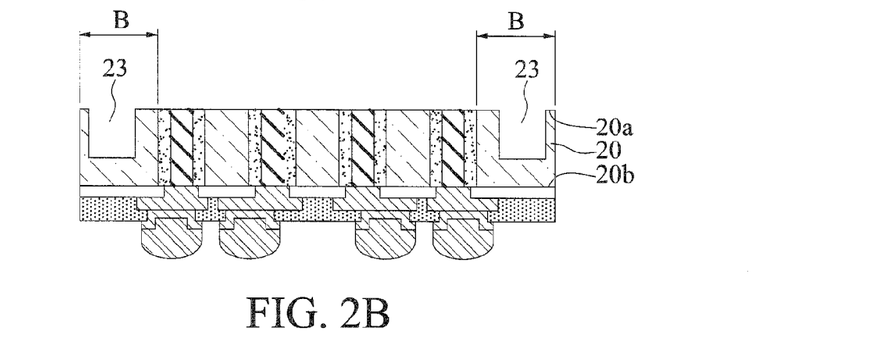
Figure 2C:
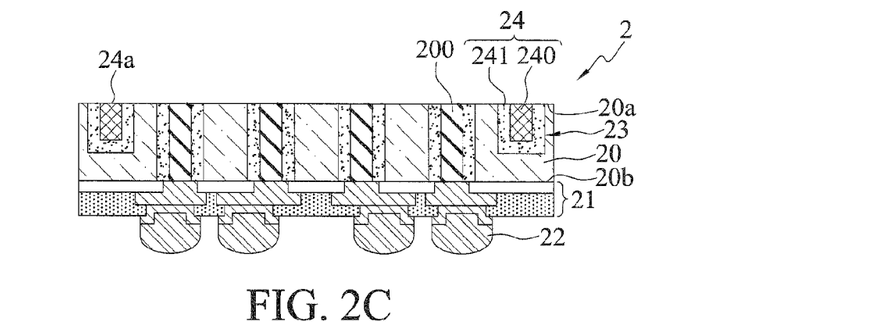

FIGS. 2A to 2C are cross-sectional diagrams illustrating a method for manufacturing a semiconductor substrate 2 in accordance with a first embodiment of the present disclosure. In an embodiment, conductive through holes are formed before pillars.

As shown in FIG. 2A, a substrate body 20 is provided. The substrate body 20 is defined with a first surface 20a and a second surface 20b opposite to the first surface 20a. The substrate body 20 includes a plurality of conductive through holes 200 penetrating and being in communication with the first surface 20a and the second surface 20b.

In an embodiment, the substrate body 20 is a silicon-containing board, such as a Through Silicon Interposer (TSI) or a glass substrate, the conductive through holes 200 are Through-silicon Vias (TSVs), and are made of copper pillars 200a and insulating materials 200b surrounding the copper pillars 200a, but the present disclosure is limited as such.

The two ends of each of the conductive through holes 200 are flush with the first surface 20a and the second surface 20b of the substrate body 20, respectively.

The first surface 20a of the substrate body 20 is defined with a central area A and a periphery area B surrounding the central area A, and the conductive through holes 200 are positioned within the central area A.

A Redistribution Layer (RDL) can be optionally formed on the second surface 20b of the substrate body 20 to form a redistribution structure 21 that is electrically connected to the conductive through holes 200. In an embodiment, the redistribution structure 21 includes at least one dielectric layer 210 and at least one circuit layer 211 stacked on the at least one dielectric layer 210. The circuit layer 211 is electrically connected to the conductive through holes 200.

Furthermore, a plurality of conductive elements 22 can be optionally disposed on the outermost circuit layer 211. In an embodiment, the conductive elements 22 include a metal layer 220 and conductive bumps 221 disposed on the metal layer 220. In another embodiment, the conductive bumps 221 include soldering materials, and the metal layer 220 is an UnderBumpMetallurgy (UBM). There are numerous structures and materials for the UBM, and no specific limitations are placed on these.

As shown in FIG. 2B, a plurality of vias 23 are formed within the periphery area B of the first surface 20a of the substrate body 20, and do not penetrate the substrate body 20.

Therefore, the vias 23 are not in communication with the second surface 20b of the substrate body 20.

As shown in FIG. 2C, a pillar 24 is disposed in each of the vias 23, and the end 24a of the pillar 24 is flush with the first surface 20a of the substrate body 20.

In an embodiment, the pillar 24 is made of an insulating material 241 and a conductive material 240. In another embodiment, the insulating material 241 (e.g., silicon dioxide ($SiO_2$)) is first formed on the walls of the via 23 by thermal oxidation, and then the conductive material 240 such as a copper material is formed in the via 23 by electroplating or deposition.

Before the conductive material 240 is formed, an adhesive layer such as a titanium material and a seed layer such as a copper material are sputtered. However, there are numerous ways for forming the pillars 24, and the present disclosure is not limited as such.

In another embodiment, as shown in FIG. 2C', the pillars 24 can be disposed before the redistribution structure 21, and the pillars 24 and the redistribution structure 21 can be positioned on the same side of the substrate body 20. In an embodiment, the pillars 24 and the redistribution structure 21 are both positioned on the first surface 20a of the substrate body 20. Therefore, it can be understood that the redistribution structure 21 can be optionally disposed on both the first surface 20a and the second surface 20b of the substrate body 20, or disposed on only one of the first surface 20a and the second surface 20b.

FIGS. 3A to 3D are cross-sectional diagrams illustrating a method for manufacturing a semiconductor substrate 3 in accordance with a second embodiment of the present disclosure. The second embodiment differs from the first embodiment in the timing of manufacturing the conductive through holes 200 and the pillars 34.

Figure 3A:
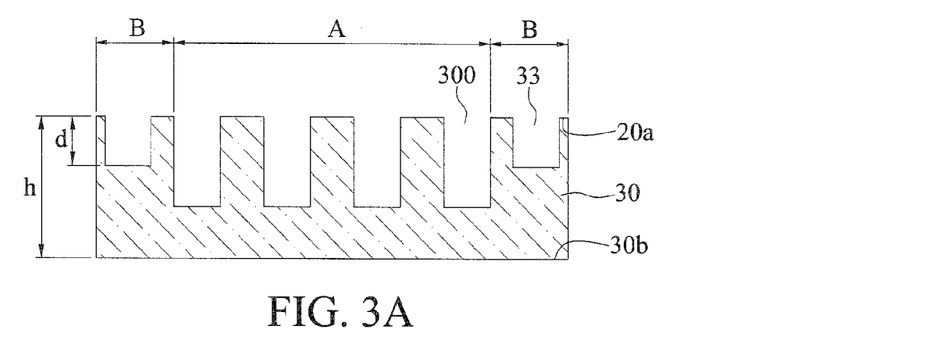
FIGS. 3A to 3D are cross-sectional diagrams illustrating a method for manufacturing a semiconductor substrate in accordance with a second embodiment of the present disclosure.

As shown in FIG. 3A, a substrate body 30 is provided, and the substrate body 30 is defined with a first surface 20a and a second surface 30b. Then, a plurality of holes 300 are formed within a central area A of the first surface 20a of the substrate body 30, and a plurality of vias 33 are formed within a periphery area B of the first surface 20a of the substrate body 30. The depth h of the holes 300 is greater than the depth d of the vias 33.

In an embodiment, the holes 300 and the vias 33 are formed by drilling or some mechanical methods, and do not penetrate the substrate body 30.

Figure 3B:
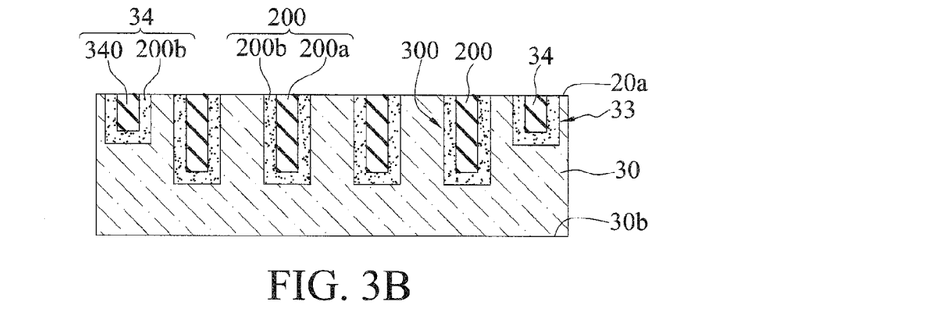

As shown in FIG. 3B, a conductive through hole 200 is formed in each of the holes 300, and a pillar 34 is formed in each of the vias 33.

In an embodiment, insulating materials (e.g., silicon dioxide (SiO$_2$)) are first formed on the walls of the holes 300 and the vias 33 by thermal oxidation, and then a metal layer such as a copper material is formed in the holes 300 and the vias 33 and on the first surface 20a of the substrate body 30 by electroplating or deposition. Chemical mechanical polishing (CMP) is used to remove the metal layer on the first surface 20a of the substrate body 30. Before the metal layer is formed, an adhesive layer such as a titanium material and a seed layer such as a copper material can be sputtered.

Thus, a conductive through hole 200 can be made of a copper pillar 200a and the insulating material 200b surrounding the copper pillar 200a, and the pillar 34 can be made of a copper lump 340 and the insulating material 200b surrounding the copper lump 340.

There are numerous methods for making the conductive through holes 200 and the pillars 34, and the present disclosure is not limited as such.

Figure 3C:
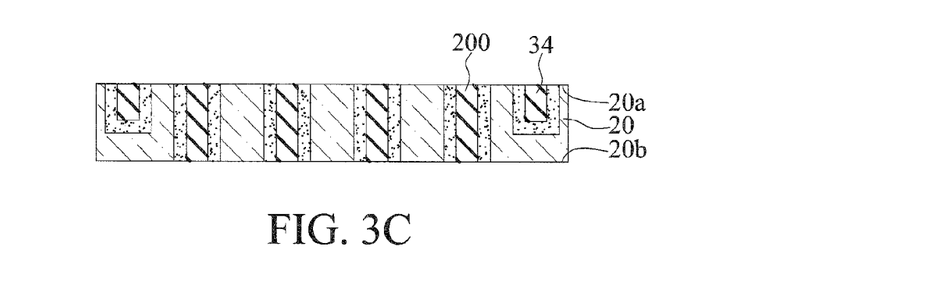

As shown in FIG. 3C, some of the material of the second surface 30b of the substrate body 30 are removed in order to thin the substrate body 30 into something similar to the substrate body 20 of FIG. 2C, such that the conductive through holes 200 penetrate the substrate body 20, while the pillars 34 do not penetrate the substrate body 20. Therefore, the pillars 34 are not in communication with the second surface 20b of substrate body 20.

In an embodiment, a polishing method is used for the thinning process, such that the ends of the conductive through holes 200 are flush with the second surface 20b of the substrate body 20.

Figure 3D:
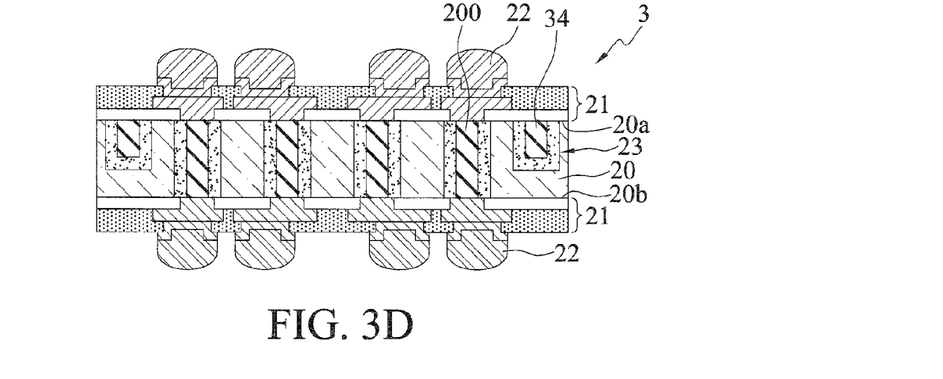

As shown in FIG. 3D, a redistribution structure 21 can be optionally disposed on the first surface 20a and/or the second surface 20b of the substrate body 20.

The semiconductor substrates 2 and 3 according to the present disclosure are designed in such a way that the pillars 24 and 34 do not penetrate the substrate bodies 20, and the warpage of the metal material is substantially greater than the silicon material. When the semiconductor substrates 2 and 3 are heated, the pillars 24 and 34 can adjust the expansion of the upper and lower sides of the substrate bodies 20 (i.e., the side of the first surface 20a and the side of the second surface 20b). Therefore, the upper and lower sides of the semiconductor substrates 2 and 3 have substantially the same thermal deformations, and the semiconductor substrates 2 and 3 are prevented from warpage.

It can be understood that in the first and second embodiments, the pillars 24 and 34 can be distributed on different sides of the substrate bodies 20. In other words, in the same substrate body, some of the pillars are disposed at the first surface 20a of the substrate body 20, while the others are disposed at the second surface 20b of the substrate body 20.

The present disclosure further provides a semiconductor substrate 2, 2' or 3, which includes a substrate body 20, a plurality of conductive through holes 200 and a plurality of pillars 24 or 34.

The substrate body 20 is a silicon-containing board, and has a first surface 20a and a second surface 20b opposite to the first surface 20a.

The conductive through holes 200 are formed in the substrate body 20 and penetrate the substrate body 20.

The pillars 24 or 34 include the conductive materials 240 (or copper lumps 340), and the pillars 24 or 34 are disposed on the first surface 20a and/or the second surface 20b of the substrate body 20, without penetrating the substrate body 20.

In an embodiment, the first surface 20a or the second surface 20b of the substrate body 20 is defined with a central area A and a periphery area B surrounding the central area A, the conductive through holes 200 are disposed within the central area A, and the pillars 24 or 34 are disposed within the periphery area B.

In an embodiment, the first surface 20a and/or the second surface 20b of the substrate body 20 are/is formed with a redistribution structure 21 that is electrically connected to the conductive through holes 200, and the redistribution structure 21 is not electrically connected to the pillars 24 or 34.

Figure 4:
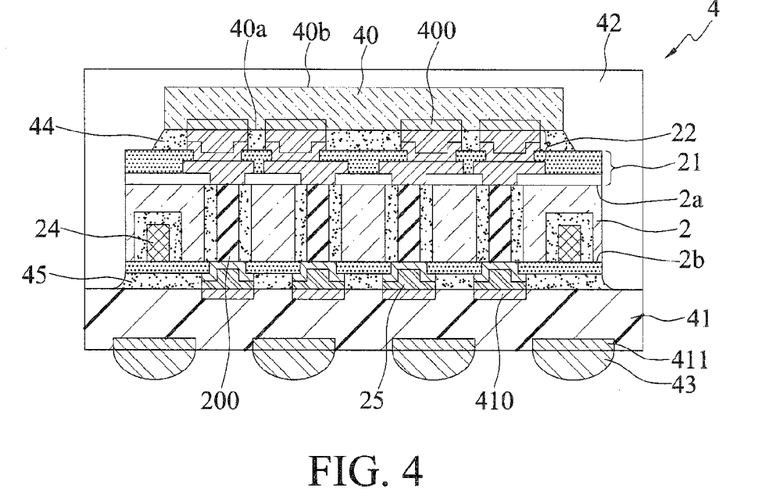
FIG. 4 is a cross-sectional diagram illustrating an electronic package according to the present disclosure.

FIG. 4 is a cross-sectional diagram illustrating an electronic package 4 according to the present disclosure. In an embodiment, the semiconductor substrate 2 shown in FIG. 2C is applied, but the semiconductor substrate 2 is used as an interposer, such that the semiconductor substrate 2 is re-defined below. In an embodiment, one of the first surface 20a and the second surface 20b of the substrate body 20 is used as the chip placement side 2a of the semiconductor substrate 2, while the other one is used as the interposer side 2b.

As shown FIG. 4, an electronic component 40 is placed on the chip placement side 2a of the semiconductor substrate 2, and the electronic component 40 is electrically connected to the various conductive through holes 200 by the redistribution structure 21. A package substrate 41 is combined onto the interposer side 2b of the semiconductor substrate 2. An encapsulating layer 42 is formed on the package substrate 41, and encapsulates the electronic component 40 and the semiconductor substrate 2.

Figure 5:
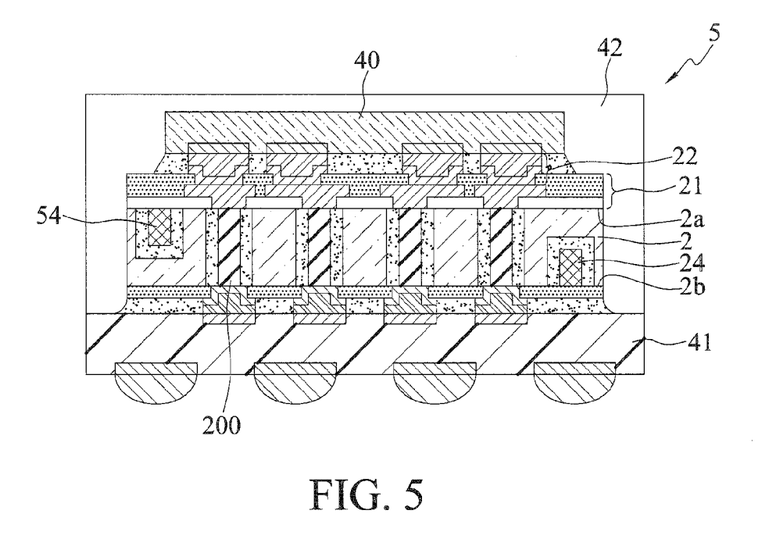
FIG. 5 is another embodiment of FIG. 4.

In an embodiment, the pillars 24 are in communication with the interposer side 2b of the semiconductor substrate 2, without communicating with the chip placement side 2a. In another embodiment, as shown in FIG. 5, pillars 54 are in communication with the chip placement side 2a of the semiconductor substrate 2, without communicating with the interposer side 2b. Refer to the previous embodiments for the making of the pillars 54. Therefore, depending on the needs, some of the pillars 54 are disposed at the chip placement side 2a, and others are disposed on the interposer side 2b, as shown in FIG. 5.

In an embodiment, the electronic component 40 can be an active component, a passive component or a combination of the two. In another embodiment, the active component is a semiconductor chip, and the passive component is a resistor, a capacitor or an inductor. In yet another embodiment, the electronic component 40 is a semiconductor chip having an active surface 40b and a non-active surface 40b opposite to the active surface 40b. The active surface 40a includes a plurality of electrode pads 400, the electronic component 40 is combined with the conductive elements 22 via the electrode pads 400, and the conductive elements 22 are covered by an underfill 44.

In an embodiment, the encapsulating layer 42 can be made of polyimide (PI), a dry film, epoxy resin or an encapsulating material.

A plurality of conductive elements 25 are disposed on the interposer side 2b of the semiconductor substrate 2 for combining and electrically connecting to solder pads 410 on the upper side of the package substrate 41. The conductive elements 25 are then covered with an underfill 45. In an embodiment, the conductive elements 25 are in contact with the conductive through holes 200, without contacting the pillars 24. Refer to the conductive elements 22 for the making of the conductive elements 25.

In a subsequent manufacturing process, a plurality of solder balls 43 are disposed on the bump pads 411 at the lower side of the package substrate 41 for combining onto a circuit board (not shown).

In the method for manufacturing the electronic package 4 or 5 according to the present disclosure, as the warpage of the copper material is much greater than that of the silicon material, when the semiconductor substrate 2 is heated, the pillars 24 or 54 can adjust the expansion of the upper and lower sides of the substrate body 20, such that the upper and lower sides of the substrate body have substantially the same expansion, and the substrate body is prevented from warpage.

As a result, during the manufacturing processes of the electronic package 4 or 5 according to the present disclosure, before a singulation process is performed, when a high temperature operation such as a reflow process is performed, the semiconductor substrate 2 is able to balance the expansions of its upper and lower sides, thus avoiding warpage of the whole structure, so that subsequently when the electronic package 4 or 5 is attached to the circuit board, non-wetting will not occur, thus increasing the production yield.

The present disclosure provides an electronic package 4 or 5, which includes a semiconductor substrate 2, an electronic component 40, a package substrate 41 and an encapsulating layer 42.

The semiconductor substrate 2 is a silicon-containing board having a chip placement side 2a and an interposer side 2b opposite to the chip placement side 2a, and the semiconductor substrate 2 has a plurality of pillars 24 or 54 and a plurality of conductive through holes 200 in communication with the chip placement side 2a and the interposer side 2b. In an embodiment, the pillars 24 or 54 include a metal material in communication with the chip placement side 2a or the interposer side 2b, without penetrating the substrate body 20.

The electronic component 40 is disposed on the chip placement side 2a of the semiconductor substrate 2 and is electrically connected to the conductive through holes 200.

The package substrate 41 is combined with the interposer side 2b of the semiconductor substrate 2 and is electrically connected to the conductive through holes 200.

The encapsulating layer 42 is formed on the package substrate 41 and encapsulates the semiconductor substrate 2 and the electronic component 40.

In an embodiment, the chip placement side 2a or the interposer side 2b of the semiconductor substrate 2 is defined with a central area A and a periphery area B surrounding the central area A. The conductive through holes 200 are disposed within the central area A, while the pillars 24 or 54 are disposed within the periphery area B.

In an embodiment, the chip placement side 2a of the semiconductor substrate 2 is formed with a redistribution structure 21 electrically connected to the conductive through holes 200, and the electronic component 40 is combined with the redistribution structure 21 and is electrically connected to the redistribution structure 21. The redistribution structure 21 is not electrically connected to the pillars 24 or 54.

In an embodiment, the pillars 24 are in communication with the interposer side 2b of the semiconductor substrate 2, without communicating with the chip placement side 2a.

In an embodiment, the pillars 54 are in communication with the chip placement side 2a of the semiconductor substrate 2 but not the interposer side 2b.

In an embodiment, the pillars according to the present disclosure can be disposed on the upper side or the lower side of the semiconductor substrate or a combination thereof. The widths, depths, quantity, positions of the pillars can be adjusted according to the amount of warpage, and is not limited to the above.

In summary, in the electronic package, the semiconductor substrate of the electronic package and the method for manufacturing the electronic package according to the present disclosure, pillars that do not penetrate the substrate body are provided in the semiconductor substrate. When the semiconductor substrate is heated, the pillars are able to adjust the expansions of the upper and lower sides of the substrate body; as a result, during high temperature operation, the electronic package is prevented from warpage, thereby increasing the production yield.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A semiconductor substrate, comprising:
a substrate body;
a plurality of conductive through holes formed in the substrate body and penetrating the substrate body; and
at least one pillar disposed in the substrate body with the at least one pillar being free from penetrating the substrate body, wherein the at least one pillar contains an insulating material and a conductive material.

2. The semiconductor substrate of claim 1, wherein the substrate body is a silicon-containing board.

3. The semiconductor substrate of claim 1, wherein the substrate body is defined with a surface having a central area and a periphery area surrounding the central area, and wherein the conductive through holes are positioned within the central area, and the at least one pillar is positioned within the periphery area.

4. The semiconductor substrate of claim 1, further comprising a redistribution structure formed on the substrate body with the redistribution structure electrically connected to the conductive through holes.

5. An electronic package, comprising:
   a package substrate;
   a semiconductor substrate provided on the package substrate and including at least one pillar free from penetrating the semiconductor substrate and a plurality of conductive through holes penetrating the semiconductor substrate and electrically connected to the package substrate, wherein the at least one pillar contains an insulating material and a conductive material;
   an electronic component provided on the semiconductor substrate and electrically connected to the conductive through holes; and
   an encapsulating layer formed on the package substrate and encapsulating the semiconductor substrate and the electronic component.

6. The electronic package of claim 5, wherein the semiconductor substrate is a silicon-containing board.

7. The electronic package of claim 5, wherein the semiconductor substrate is defined with a surface having a central area and a periphery area surrounding the central area, and wherein the conductive through holes are positioned within the central area, and the at least one pillar is positioned within the periphery area.

8. The electronic package of claim 5, further comprising a redistribution structure formed on the semiconductor substrate with the redistribution structure electrically connected to the conductive through holes and the redistribution structure combined with the package substrate or the electronic component.

* * * * *